United States Patent
Kuninobu

(10) Patent No.: US 10,726,170 B2
(45) Date of Patent: Jul. 28, 2020

(54) SIMULATION MACHINE AND SIMULATION METHOD

(71) Applicant: Kabushiki Kaisha Toshiba, Minato-ku (JP)

(72) Inventor: Shigeta Kuninobu, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 456 days.

(21) Appl. No.: 15/269,064

(22) Filed: Sep. 19, 2016

(65) Prior Publication Data

US 2017/0185703 A1 Jun. 29, 2017

(30) Foreign Application Priority Data

Dec. 25, 2015 (JP) ................................ 2015-255110

(51) Int. Cl.
G06F 30/20 (2020.01)

(52) U.S. Cl.
CPC ..................... G06F 30/20 (2020.01)

(58) Field of Classification Search
CPC ................................................ G06F 17/5009
USPC .................................................. 703/2, 7, 13
See application file for complete search history.

(56) References Cited

U.S. PATENT DOCUMENTS

| | | | |
|---|---|---|---|
| 7,444,269 B2 * | 10/2008 | Drumheller | G06F 17/509 29/857 |
| 7,584,086 B2 * | 9/2009 | Frankel | E21B 43/00 703/10 |
| 8,423,319 B2 * | 4/2013 | Hill | F17D 5/00 324/207.13 |
| 8,706,452 B2 * | 4/2014 | Miller | G06F 17/50 703/2 |
| 8,775,428 B2 * | 7/2014 | Birdwell | G06K 9/6224 707/737 |
| 9,466,045 B1 * | 10/2016 | Kumar | G06Q 10/087 |
| 9,494,937 B2 * | 11/2016 | Siegel | G05D 1/0027 |

(Continued)

FOREIGN PATENT DOCUMENTS

| | | |
|---|---|---|
| JP | 2008-93751 A | 4/2008 |
| JP | 2008-123359 A | 5/2008 |

(Continued)

*Primary Examiner* — Juan C Ochoa
(74) *Attorney, Agent, or Firm* — Oblon, McClelland, Maier & Neustadt, L.L.P.

(57) ABSTRACT

A simulation-machine includes: a LP problem creator creates a linear programming problem in which a transport amount per unit time between respective processing machines handling an nth process and a processing machine handling an (n+1)th process is set as a variable, based on layout data, process data, machine data and production volume data, the layout data including transport sections, a load position, a transport cost and an arrangement position in the transport path, the process data including a sequence of processing the processes, the machine data including association information between the process and the processing machine, and the production volume data including a load amount at the load position; and a calculator calculates a transport amount per unit time for each of the transport sections by using the transport amount per unit time between the processing machines in all the processes included in a solution of the linear programming problem.

13 Claims, 10 Drawing Sheets

(56) References Cited

U.S. PATENT DOCUMENTS

| | | | | |
|---|---|---|---|---|
| 2006/0247902 | A1* | 11/2006 | Rourke | G06F 17/5004 |
| | | | | 703/1 |
| 2007/0282618 | A1* | 12/2007 | Barahona | G06Q 10/04 |
| | | | | 705/338 |
| 2010/0088011 | A1* | 4/2010 | Bruce | G01C 21/20 |
| | | | | 701/532 |
| 2012/0179624 | A1* | 7/2012 | Berry | G06Q 10/06 |
| | | | | 705/338 |
| 2014/0303951 | A1* | 10/2014 | Houeto | E21B 43/00 |
| | | | | 703/10 |
| 2016/0189072 | A1* | 6/2016 | Kuroki | G06Q 50/04 |
| | | | | 705/7.24 |
| 2017/0003694 | A1* | 1/2017 | Carvajal | G05B 19/0428 |

FOREIGN PATENT DOCUMENTS

| | | |
|---|---|---|
| JP | 2008-310467 A | 12/2008 |
| JP | 2009-166978 A | 7/2009 |
| JP | 4915302 B2 | 4/2012 |

\* cited by examiner

PRODUCT TYPE X
PRODUCT PROCESSES:
LOAD → PROCESS P1 → PROCESS Q → PROCESS P2 → PROCESS R → EJECT
PRODUCT TYPE Y
PRODUCT PROCESSES:
. . . . . . . . . . . . . . . . . . . . . . . . . . . . . . . . . . . . . . . . .
* PRODUCT TYPE CAN BE PLURAL

PROCESSING MACHINE A CAN HANDLE PROCESSES P1 AND P2.
PROCESSING MACHINE B CAN HANDLE PROCESS Q.
PROCESSING MACHINE C CAN HANDLE PROCESS R.
PROCESSING MACHINE C CAN ...

EXAMPLE IN WHICH TRANSFER FLOW RATE IS SHOWN
TOGETHER WITH TRANSPORT COST ON LAYOUT DATA

VALUE OBTAINED BY EQUALLY DIVIDING TRANSPORT COST OF TRANSPORT SECTION BY NUMBER OF PROCESSING MACHINES AND BRANCH POINTS

NUMERALS WRITTEN IN BRACKETS INDICATE TRANSPORT COST IN TRANSPORT SECTION

EXAMPLE IN WHICH TRANSPORT FLOW RATE IS SHOWN TOGETHER WITH TRANSPORT COST ON LAYOUT GRAPH

SIMULATION MACHINE AND SIMULATION METHOD

CROSS REFERENCE TO RELATED APPLICATIONS

This application is based upon and claims the benefit of priority from the prior Japanese Patent Application No. 2015-255110, filed on Dec. 25, 2015, the entire contents of which are incorporated herein by reference.

FIELD

The embodiments of the present invention relate to a simulation machine and a simulation method for simulating a use status (a congestion status) of a transport path that transports goods between different processing machines.

BACKGROUND

In a semiconductor plant, semi-finished goods undergo a plurality of processes set for each product type to become finished products. A plurality of processing machines that handle the processes are connected via a transport path, and semi-finished goods use the transport path to move to the next processing machine. For efficient production, efficient layout design of the processing machines and the transport path is required, and a simulator that can visualize the use status of the transport path beforehand in a designing stage is used. By using this simulator, efficient arrangement of a manufacturing machine and the transport path becomes possible even in a complicated manufacturing process, thereby enabling to reduce a takt time and the manufacturing cost.

At present, a generally used simulator performs a simulation so as to simulate the movement of semi-finished goods along a time series, such as in which process the semi-finished goods are present or on which transport path the semi-finished goods are present. In the simulation performed along a time series, a considerable simulation time is required in a case of a large-scale and complicated manufacturing process such as those in a semiconductor plant, thereby imposing a burden at the time of examining the efficient layout design of the manufacturing machine and the transport path.

Accordingly, there has been required establishment of a simulator that can simulate the use status up to the final state without requiring a large-scale simulation model and a considerable simulation time.

DETAILED DESCRIPTION

A simulation machine according to an embodiment includes:

a LP problem creator creates a linear programming problem in which a transport amount per unit time between respective processing machines handling an nth process and a processing machine handling an (n+1)th process is set as a variable, based on layout data, process data, machine data and production volume data, the layout data including a plurality of transport sections constituting a transport path for transporting goods, a load position at which the goods are loaded in the transport path, a transport cost including a cost required for transporting the goods for each of the transport sections, and an arrangement position in the transport path of a plurality of processing machines handling a plurality of processes with respect to the goods, the process data including a processing order with respect to the goods, the machine data including association information between the process and the processing machine that can handle the process, and the production volume data including a load amount at the load position; and a calculator calculates a transport amount per unit time for each of the transport sections by using the transport amount per unit time between the processing machines in all the processes included in a solution of the linear programming problem.

The simulation machine according to the embodiment is described below with reference to the accompanying drawings.

First Embodiment

Figure 1:
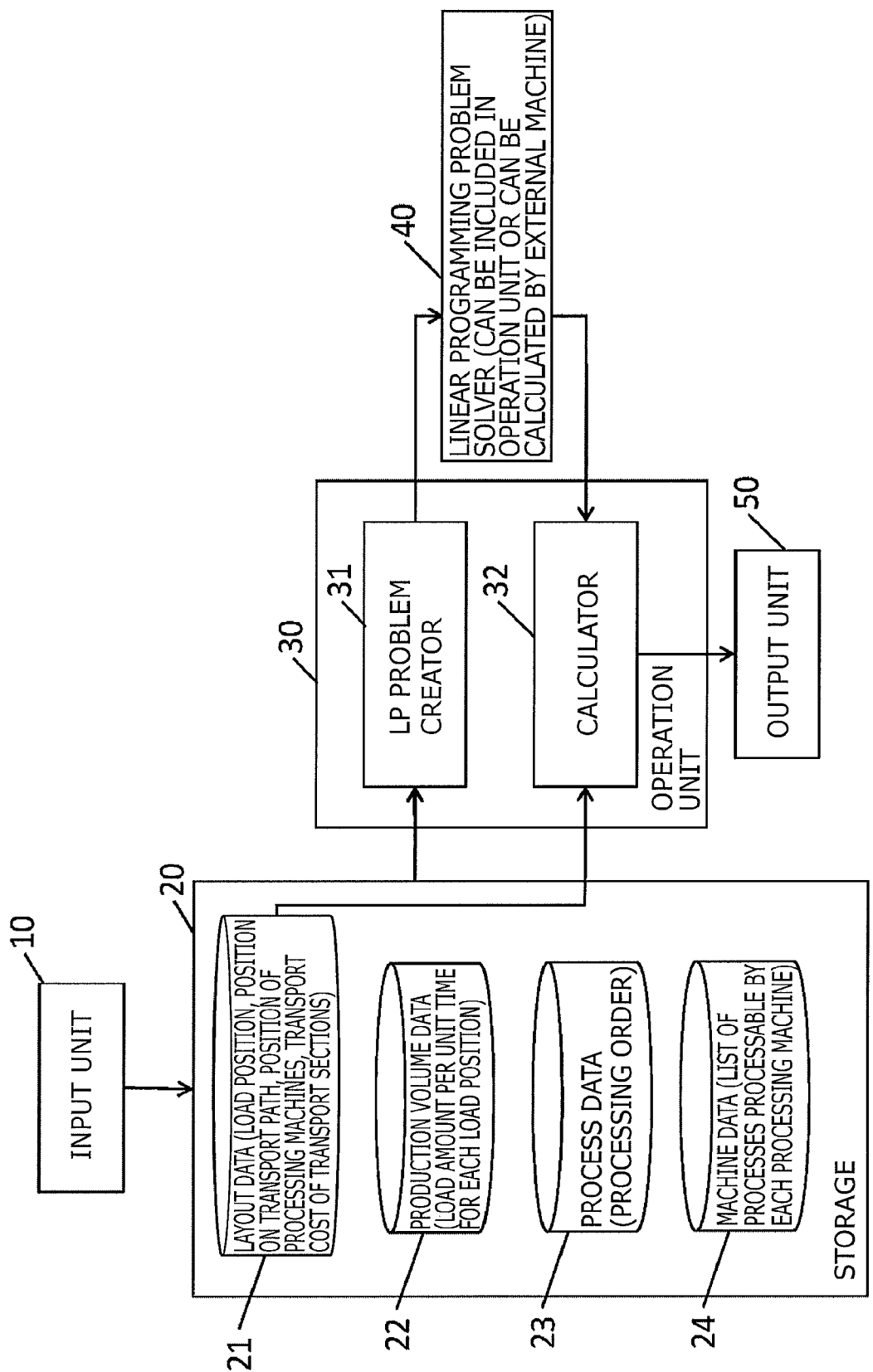
FIG. 1 is a block diagram of a first embodiment.
Figure 2:
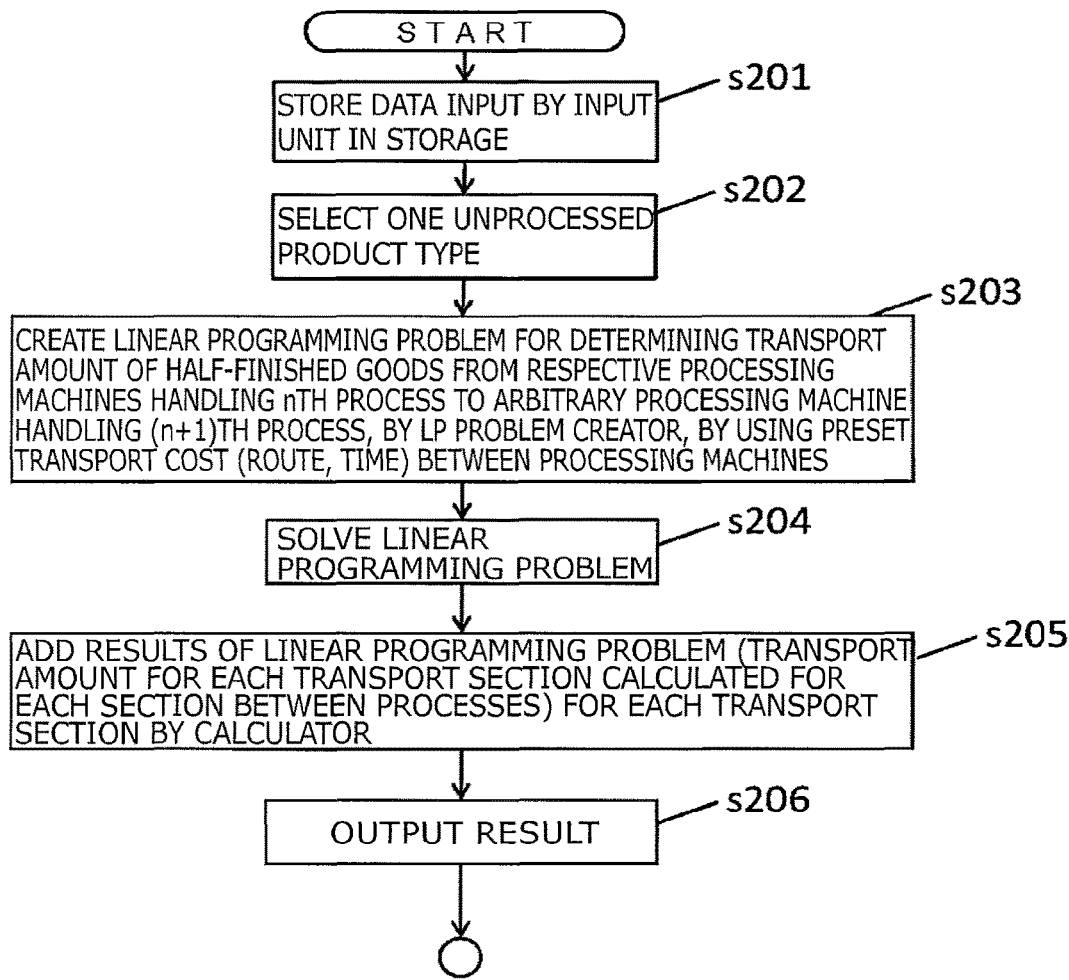
FIG. 2 is a flowchart of the first embodiment.

FIG. 1 is a block diagram showing a simulation machine according to a first embodiment. FIG. 2 is a flowchart of the simulation machine.

The simulation machine according to the first embodiment includes an input unit 10 that collects various parameters (layout data 21, production volume data 22, process data 23, and machine data 24) used for simulations, a storage 20 that stores therein a parameter acquired from the input unit 10, an operation unit 30 that simulates a transport amount per unit time based on the parameter according to linear programming, and adds the transport amounts per unit time acquired by a simulation to obtain a congestion status of a transport path in a normal state, and an output unit 50 that outputs the congestion status of the transport path in a normal state.

A parameter required for performing operations in the operation unit is input to the input unit 10.

As described later, in a case of a semiconductor plant, transport paths that transport goods and a plurality of processing machines that receive goods from the transport path to perform a predetermined process, and returns transported goods to the transport path after performing the process are arranged in a distributed manner. The layout data 21 includes such layout information. The production volume data 22 indicates an amount of goods loaded on the transport path per unit time. The process data 23 indicates an order of the processes applied to the goods (for each product type).

The machine data 24 indicates which process can be processed in the processing machine for each of processing machines arranged in a distributed manner. The goods referred to herein include semi-finished goods, manufactured goods, finished products, and the like.

An input unit can directly input data by using a computer, or can input data by using a USB memory or the like having the parameter data described above stored therein.

The storage 20 stores therein the parameters input from the input unit 10, and a memory medium such as a hard disk can be exemplified as the storage 20 (S201). As the layout data 21, the simulation machine according to the first embodiment includes a plurality of transport sections (between branch points of the transport path) constituting the transport path in order to transport goods, a loading position where the goods are loaded on the transport path, a transport cost including a cost required for transporting the goods for each of the transport sections (including at least one of transport direction, distance, transport time required for transporting the goods, energy required for transporting the goods, and the like), and arrangement position on the transport path of the processing machines that handle a plurality of processes with respect to the goods. Various pieces of data specified by a user can be input and stored in the storage 20 other than the data above described.

Figure 3:
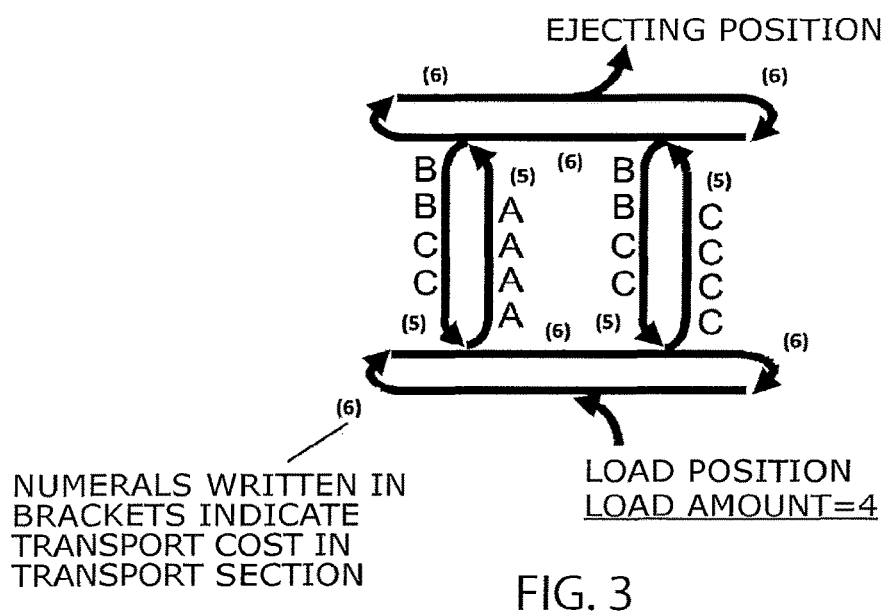
FIG. 3 is an example of layout data and production volume data.

FIG. 3 is an example showing the production volume data 22 overlapped on the layout data 21. In the layout data 21, arrangements of the transport paths and the processing machines and the like are shown. Arrows in FIG. 3 indicate transport paths and the transport direction thereof, and reference characters A to C indicate types and positions of the processing machines. Numerals in brackets on the transport path indicate a transport cost in the transport section. For example, the transport cost in the transport section from the loading position to the first branch point in FIG. 3 is expressed by 6. With an increase of the value, it indicates that the transport cost in the transport section is large.

The production volume data 22 is indicated as the loading position of goods on the transport path, and a loaded amount of the goods at the loading position per unit time and an ejecting position. In FIG. 3, there is only one loading position and one ejecting position. However, there can be a plurality of these positions.

Figures 4, 5, 6:
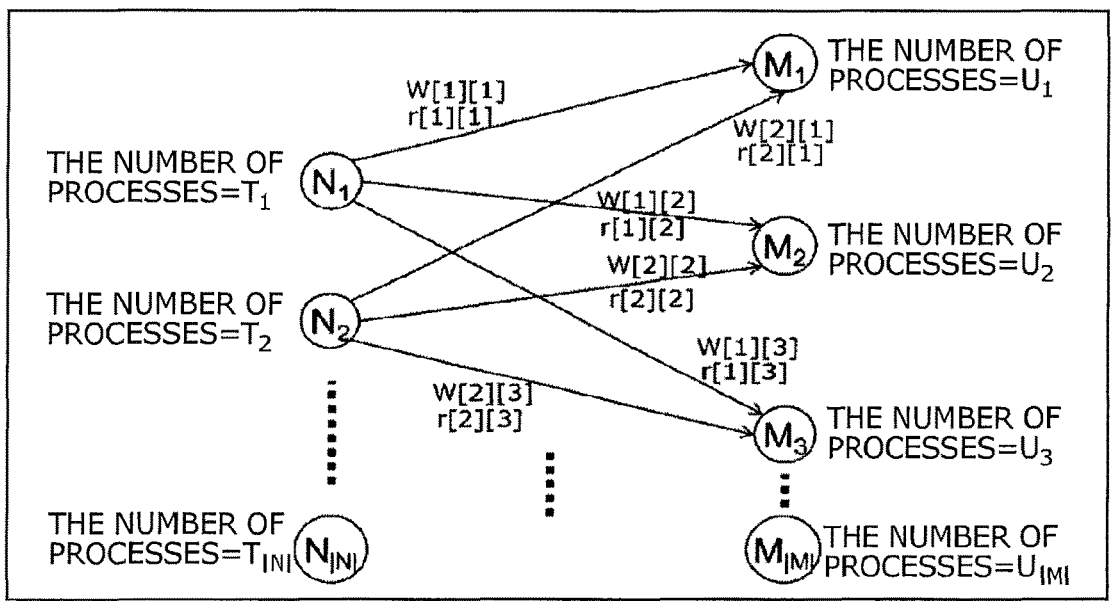
FIG. 4 is an example of process data.
FIG. 5 is an example of machine data.
FIG. 6 is a creation example of a linear programming problem.

FIG. 4 shows an example of the process data 23. In this example, the order of respective processes from loading to ejecting of a product type X is shown. The product type represents the type of manufactured products, and there can be a plurality of product types, or the order of processes can be different for each product type. It is possible to select for which product type a simulation is performed (S202).

FIG. 5 shows an example of the machine data 24. For example, the machine data 24 indicates information such that a processing machine A can handle processes P1 and P2, and a processing machine B can handle a process Q.

The operation unit (operation circuit) 30 creates a linear programming problem based on the data in the storage 20, and solves the problem to simulate the congestion status of the transport path. The operation unit 30 includes a LP problem creator 31 that creates the linear programming problem according to a transport flow rate between the processing machines and solves the created linear programming problem by using a solver 40, and a calculator 32 that adds the transport flow rate solved by the solver for each transport section.

The linear programming problem is a problem to maximize or minimize a linear objective function under provided linear (primary expression) equality and inequality constraints. The linear programming problem has a simple structure, and can be solved at a high speed even in a large scale, and is a very functional and powerful mathematical model.

The LP problem creator 31 creates the linear programming problem for each process in a processing order column included in the process data 23. A constant and a variable are defined for describing functions of the LP problem creator 31.

It is assumed that the processing machines that can handle the nth process are N1 to N|N| (assuming that there are |N| processing machines) and the processing machines that can handle the (n+1)th process are M1 to M|M| (assuming that there are M|M processing machines). It is also assumed that the number of goods processed by the processing machines N1 to N|N| is respectively T1 to T|N| (constant). Further, it is assumed that variables to store the number of goods processed by the processing machines M1 to M|M| are u1 to u|M|. While T1 to T|N| are constants, u1 to u|M| are variables.

The linear programming problem created by the LP problem creator 31 is a problem to obtain the number of goods to be processed in the (n+1)th process by using the number of goods (T1 to T|N|) to be processed in the nth process. Because the number of processes of the machine that handles a process n=0 corresponds to the loaded amount, an amount of goods processed in the respective processes by the respective machines is obtained one after another like solving recurrence relations.

It is assumed that W[n][m] is a transport cost of a transport route between the processing machines from a processing machine Nn to a processing machine Mm. The transport route includes a plurality of transport sections. The transport route between the processing machines in the first embodiment is provided by a user beforehand or is input as the shortest route and is provided as a constant.

r[n][m] is a variable to store the transport flow rate of the goods between the processing machines from the processing machine Nn to the processing machine Mm. The transport flow rate between the processing machines is a transport amount per unit time, and indicates that as the flow rate is large, the part is congested.

The linear programming problem created by the LP problem creator 31 becomes a problem to obtain values of variables of u1 to u|M| and a variable r[n][m]. FIG. 6 is a creation example of the linear programming problem. The number of goods ejected from the processing machine N1 is T1, and is arbitrarily distributed to the processing machines M1 to M|M|. The number of goods T2 to T|N| ejected from other processing machines N2 to N|N| is also arbitrarily distributed to the processing machines M1 to M|M|.

A constraint equation essential to the linear programming problem includes a formula (1) representing that the flow rate ejected from the processing machine Nn matches the flow rate processed by the processing machine Nn for flow conservation, $$\sum_{m=1}^{|M|} r[n][m] = T_n \text{ for all } n = 1, \ldots, |N| \tag{1}$$

and a formula (2) representing that the amount of goods processed by the processing machine Mm matches the flow rate input to the processing machine Mm.

$$\sum_{n=1}^{|N|} r[n][m] = u_m \text{ for all } m = 1, \ldots, |M| \quad (2)$$

The objective function is a formula (3) representing minimization of the transport cost. The objective function can be appropriately changed according to the contents to be simulated. For example, when a simulation in which the transport cost is maximized is to be performed, min. is changed to max. (S203).

$$\min. \sum_{n=1}^{|N|} \sum_{m=1}^{|M|} W[n][m] \times r[n][m] \quad (3)$$

When the equation (3) is solved by using the solver for solving the linear programming problem as calculation means for the linear programming problem created in this manner, values of the variables u1 to u|M| and the variable r[n][m] in the formula (3) are obtained (S204).

The solver is software for performing calculation, and there can be mentioned Gurobi, CPLEX, and the like as a solver for a general linear programming problem. The linear programming problem solver 40 can be included in the operation unit, or after the linear programming problem is calculated by using an external machine including a solver, the solution can be returned to the operation unit 30.

The calculator 32 receives a value of the variable r[n][m] created by the LP problem creator 31 (the solution obtained by the linear programming problem solver 40). The value of the variable r[n][m] indicates a transport amount per unit time from the processing machine Nn in the process n to the processing machine Mn in the process (n+1). Because the transport cost of the transport route between the processing machines is provided by a user beforehand and already known, it is known in which transport section in the layout data a flow rate corresponding to the value of r[n][m] is generated.

The calculator 32 adds the values of all the variables r[n][m] for each transport section (S205). At a point of time when addition of the values of r[n][m] for each transport section is complete regarding between arbitrary processes, the result is output (S206).

The calculator 32 also receives the values of the variables u1 to u|M| created by the LP problem creator 31 (the solution obtained by the linear programming problem solver 40). The values of the variables u1 to u|M| indicate the amounts of goods processed by the machines M1 to M|M|. When the values of the variables u1 to u|M| are added for each processing machine regarding between arbitrary processes, the amount of goods to be finally processed by the respective machines can be calculated.

The calculation of the operation unit 30 is mainly performed by a CPU (central processing unit) of a computer based on the data stored in the storage 20.

The output unit 50 displays a simulation result of the congestion status of the transport path by using a monitor or the like. Specifically, a result of the transport flow rate for each transport section obtained by the calculator 32 is displayed.

Figure 7:
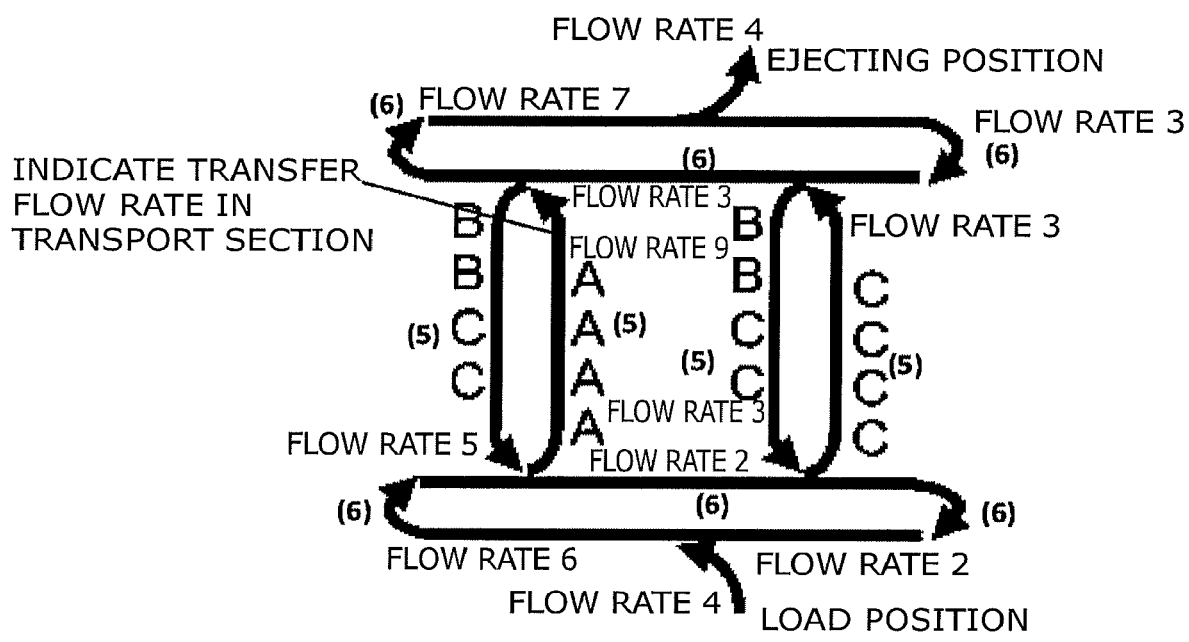
FIG. 7 shows a result obtained by a calculator (a transport flow rate is displayed on layout data)

For example, FIG. 7 shows a display of the transport flow rate obtained by the calculation unit 32 on the layout data 21 in FIG. 3. This is the final simulation result when the transport cost of the transport route between the processing machines is calculated as a minimum value. The transport flow rate for each transport section, which is a section between branch points of the transport path, is displayed on the layout data 21.

As described above, the transport flow rate indicates a transport amount of goods per unit time. In the case of the example shown in FIG. 7, it is shown that the flow rate at the point of the processing machine A is 9 in the transport path, which means congestion.

As described above, according to the first embodiment, the linear programming problem that can calculate the transport amount per unit time for each transport section between the processes in a normal state at a high speed is created, and the use status of the transport section in a normal state can be calculated at a high speed.

Second Embodiment

Figure 8:
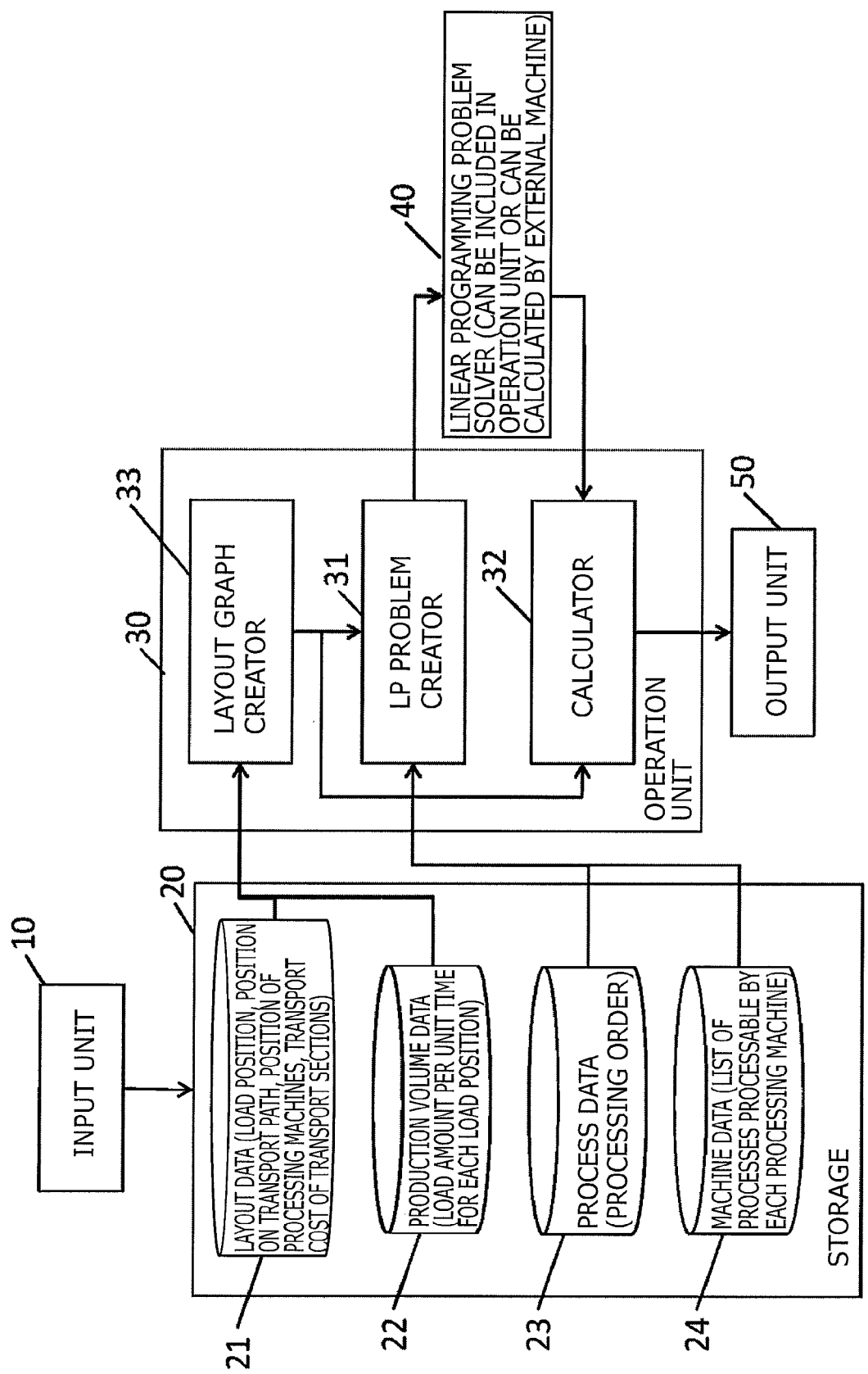
FIG. 8 is a block diagram of a second embodiment.
Figure 9:
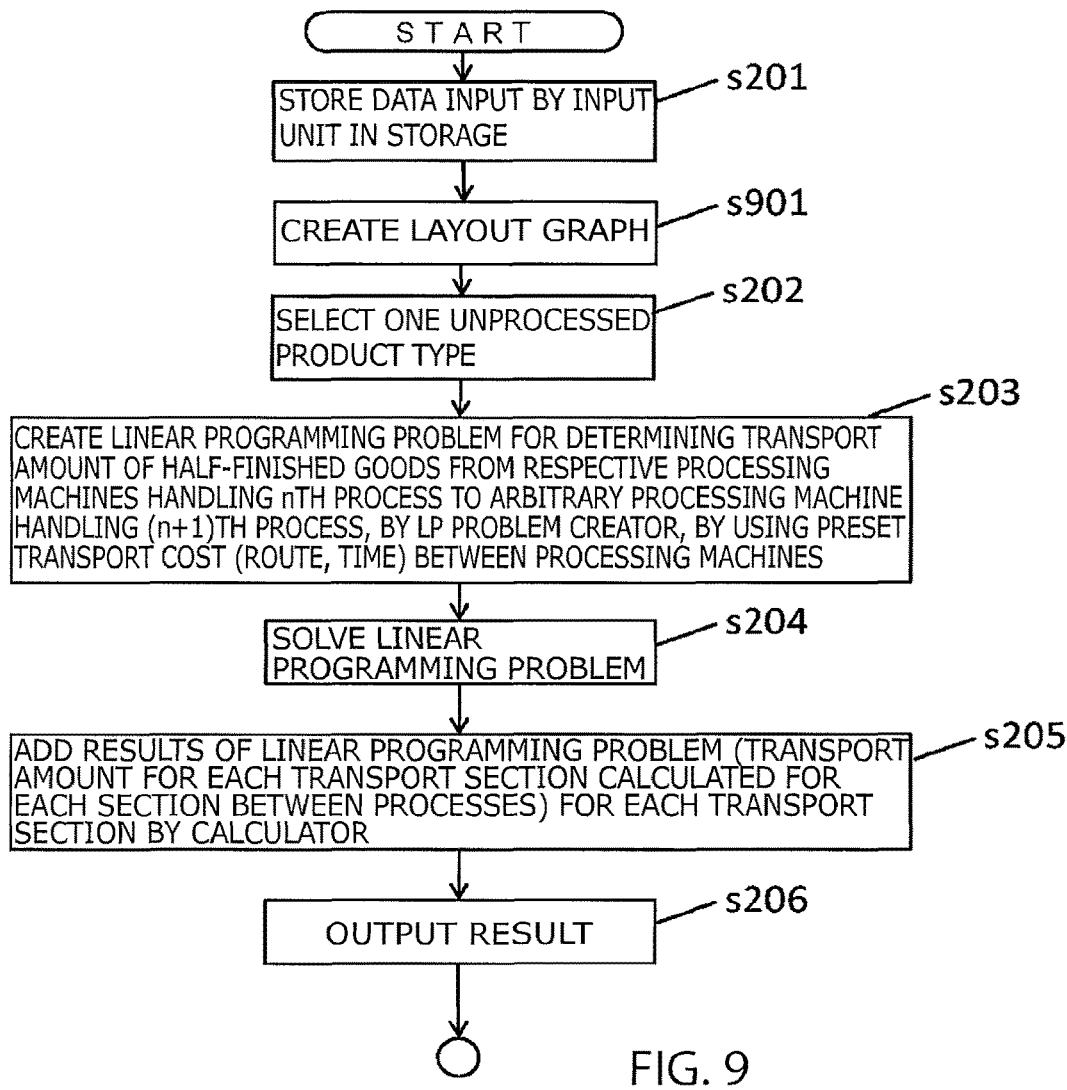
FIG. 9 is a flowchart of the second embodiment.

FIG. 8 is a block diagram showing a second embodiment.
FIG. 9 is a flowchart of the second embodiment.

As procedures of the second embodiment, there is a procedure of creating a layout graph by a layout graph creator 33 in the operation unit 30 based on the layout data 21 in the storage. Procedures other than this are identical to those of the first embodiment, and thus the layout graph creator 33 newly added here is described.

The layout graph is a weighted digraph in which a load position, a branching position of the transport path, and the position of the processing machine in the layout data in FIG. 3 are designated as nodes, the transport direction is designated as a direction of a directed edge, and the weight of the directed edge is designated as a transport cost.

The layout graph is created by the layout graph creator 33 in the operation unit 30 by using the layout data 21 and the production volume data 22 in the storage 20 (S901).

Figure 10:
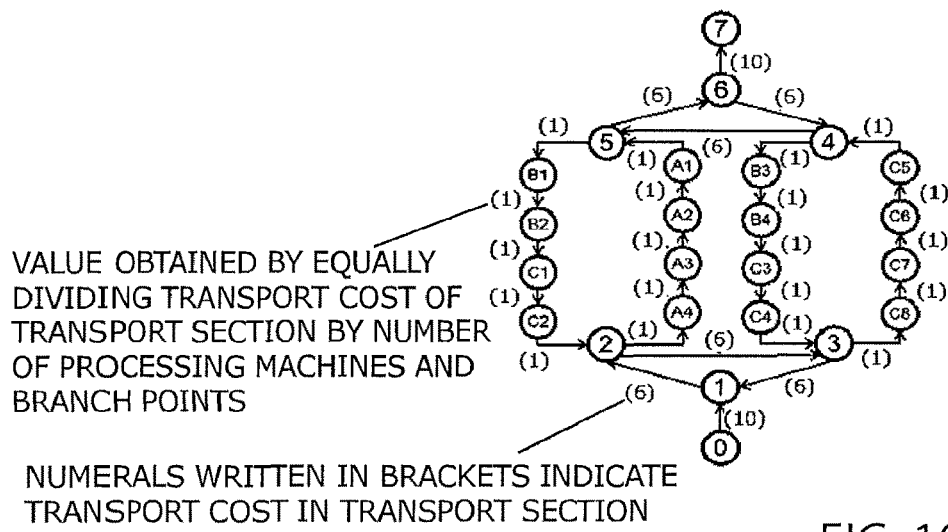
FIG. 10 is a layout graph.

FIG. 10 shows an example of the layout graph. A number is added to the branch point to create a node at each position of the processing machines, and the name is changed even between the same processing machines. The processing machines A in the layout data 21 in FIG. 3 are designated as A1 to A4. The numerals between the processing machines indicate the transport cost required for shifting goods between adjacent processing machines. Basically, the transport cost is obtained by equally dividing the transport cost of the transport section by the number of processing machines present in the transport section. In the case of FIG. 10, the transport cost of the transport section between the nodes 5 and 2 is respectively 5, and four processing machines are respectively present between the nodes 5 and 2. Therefore, the transport cost between the adjacent processing machines becomes 1 respectively. In the layout data 21, the transport cost is indicated for each transport section. However, the transport cost is indicated for each adjacent node in the layout graph.

When the transport cost for each section between the adjacent processing machines is predetermined, a user can decide the transport cost respectively. Accordingly, even if there are a plurality of processing machines in the transport section, a finer transport cost can be known.

In the example of FIG. 10, a node is also created with respect to the ejecting position. However, in the process data, the processing order column in which the final process is designated as the ejecting position can be considered without handling the ejecting position as any special position.

Furthermore, sections between the nodes 2 and 5 and between the nodes 3 and 4 being the branch point on the transport path are arranged to have an equal transport cost. However, a plurality of processing machines in one transport section can be represented by one node. When a machine section in which the same machines are combined is considered, a plurality of processing machines can be represented by one node.

By creating such a layout graph, the shortest route can be easily calculated by using an algorithm such as a Dykstra method. The Dykstra method is an algorithm that can obtain the shortest distance and route from a start to a goal based on a graph theory that solves the shortest route efficiently. As the transport cost of the transport route between the processing machines according to the first embodiment, a transport cost provided by the user beforehand is used. However, the shortest route between the processing machines can be provided by using the algorithm and layout graph described above.

Figure 11:
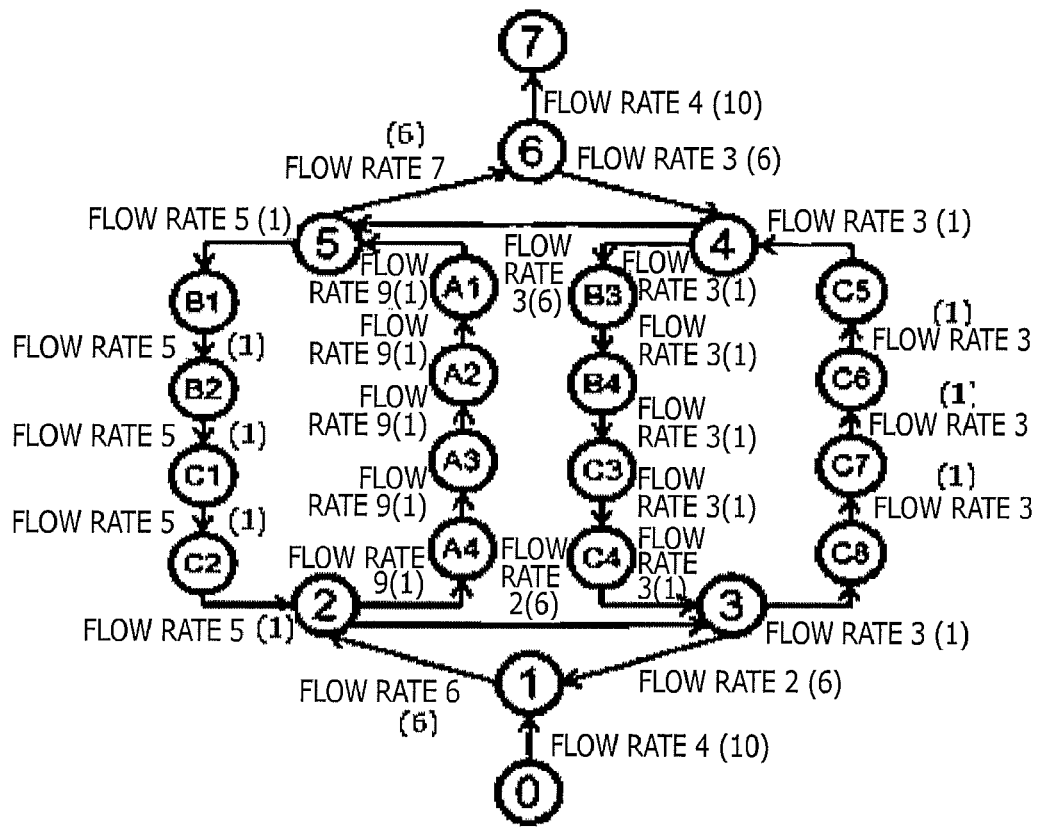
FIG. 11 shows a result obtained by a calculator (a transport flow rate is displayed on a layout graph)

As the example shown in FIG. 11, the result obtained by the calculator 32 can be output to and displayed on the layout graph. As the layout information for calculating in the operation unit, the layout information can be provided by the layout graph instead of the layout data 21.

As described above, according to the second embodiment, by creating a layout graph, the layout data 21 can be converted to minimum required information to facilitate problem creation by the LP problem creator 31.

Third Embodiment

Figure 12:
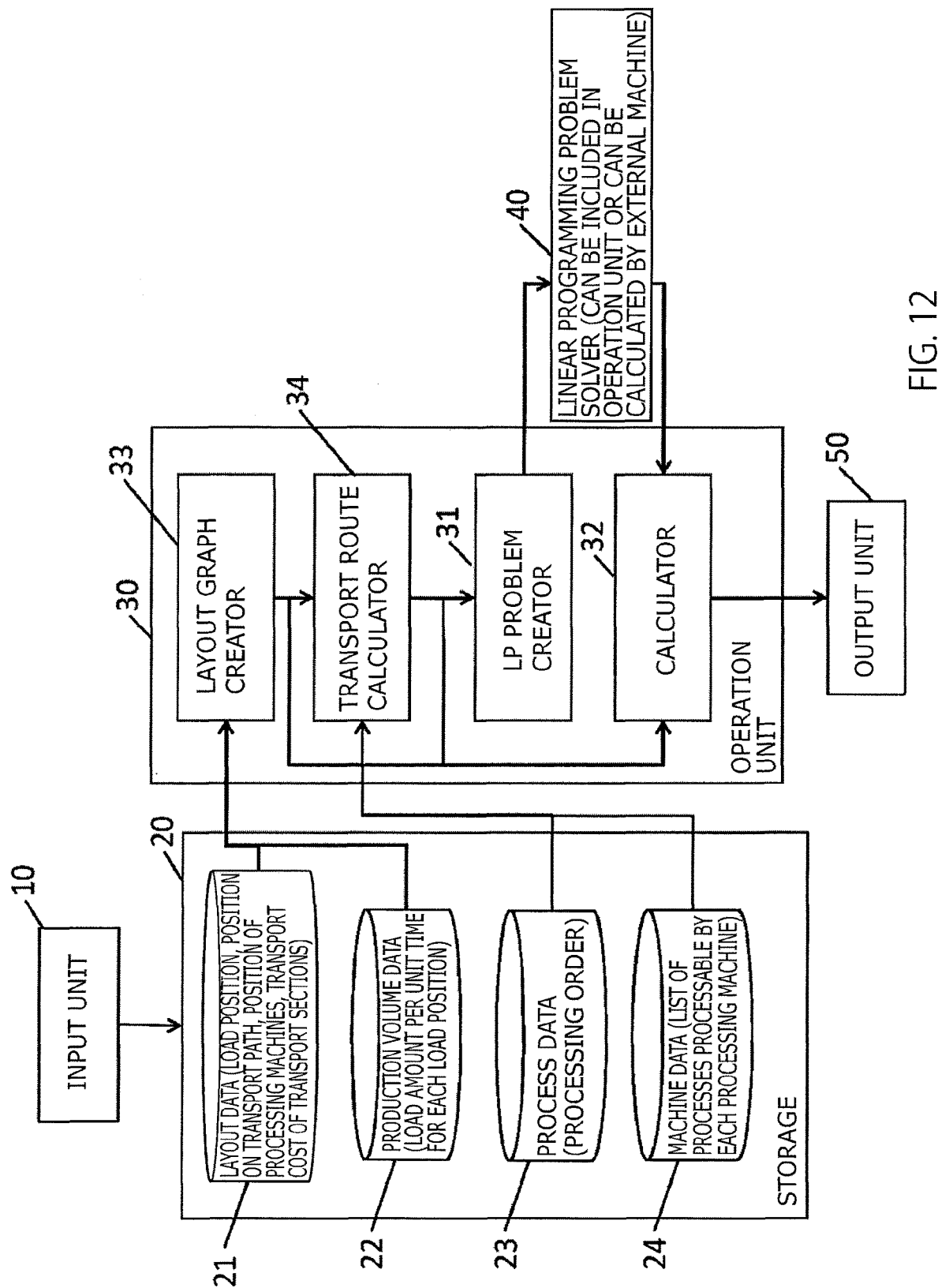
FIG. 12 is a block diagram of a third embodiment.
Figures 13, 14:
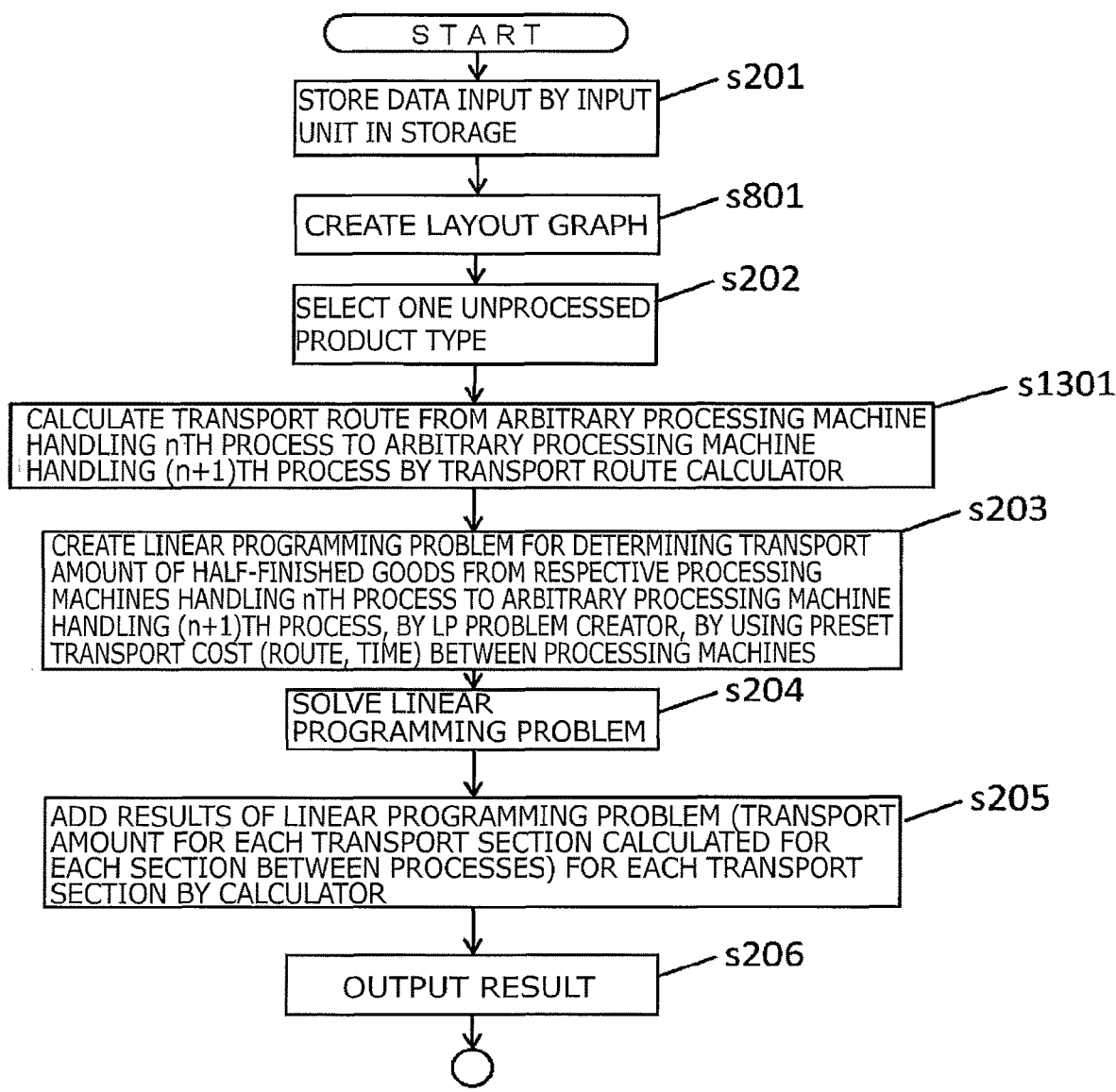
FIG. 13 is a flowchart of the third embodiment.
FIG. 14 is an example of a result obtained by a transport route calculator (a result when minimum transport cost is searched)

FIG. 12 is a block diagram showing a third embodiment. FIG. 13 is a flowchart of the third embodiment.

As procedures of the third embodiment, there is a procedure of calculating the transport route of goods between the processing machines by a transport route calculator 34 in the operation unit 30. Procedures other than this are identical to those of the other embodiments, and thus the transport route calculator 34 newly added here is described.

The transport route refers to a route in which goods pass through the transport path including a plurality of transport sections. It is described here as the transport route, but it is understood here as the same meaning as the transport cost.

The transport route calculator 34 determines the transport route from the respective processing machines that handle the nth process to an arbitrary processing machine that handles the (n+1)th process based on the machine data and the layout graph. It is considered here that the processing machine that handles the process of n=0 is the load position, and the processing machine that handles the process of n=|N|+1 is the ejecting position (the number of processes is designated as |N|).

For example, the n=0 processing machine includes a node 0 in the layout graph in FIG. 10, and the n=1 processing machine includes four points of the nodes A1 to A4 in the layout graph. Therefore, as the result obtained by the transport route calculator 34, the first four lines in FIG. 14 can be acquired (when a route with the minimum transport route is searched). Similarly, the transport route is calculated for between the processing machines (A1 to A4) that handle the process of n=1 and arbitrary processing machines (B1 to B4) that handle the process of n=2 (S1301). From the result obtained by the transport route calculator 34, the transport route is found for between all the processing machines in which shift of goods can occur.

The route calculated by the transport route calculator 34 is a route with the transport route between the processing machines being the minimum, a so-called "shortest route".

However, if there is a route specified by the user, the route can be returned as a result to the transport route calculator 34.

W[n][m] being the transport cost of the transport route between the processing machines to be used as the objective function of the linear programming problem is provided as a constant from the result obtained by the transport route calculator 34.

As described above, according to the third embodiment, by enabling automatic determination of the transport route between the processing machines (for example, the shortest route) without requiring to provide the transport route between the processing machines as input information, the transport route can be used at the time of designing the machine layout for which the transport route is not determined.

Fourth Embodiment

Figure 15:
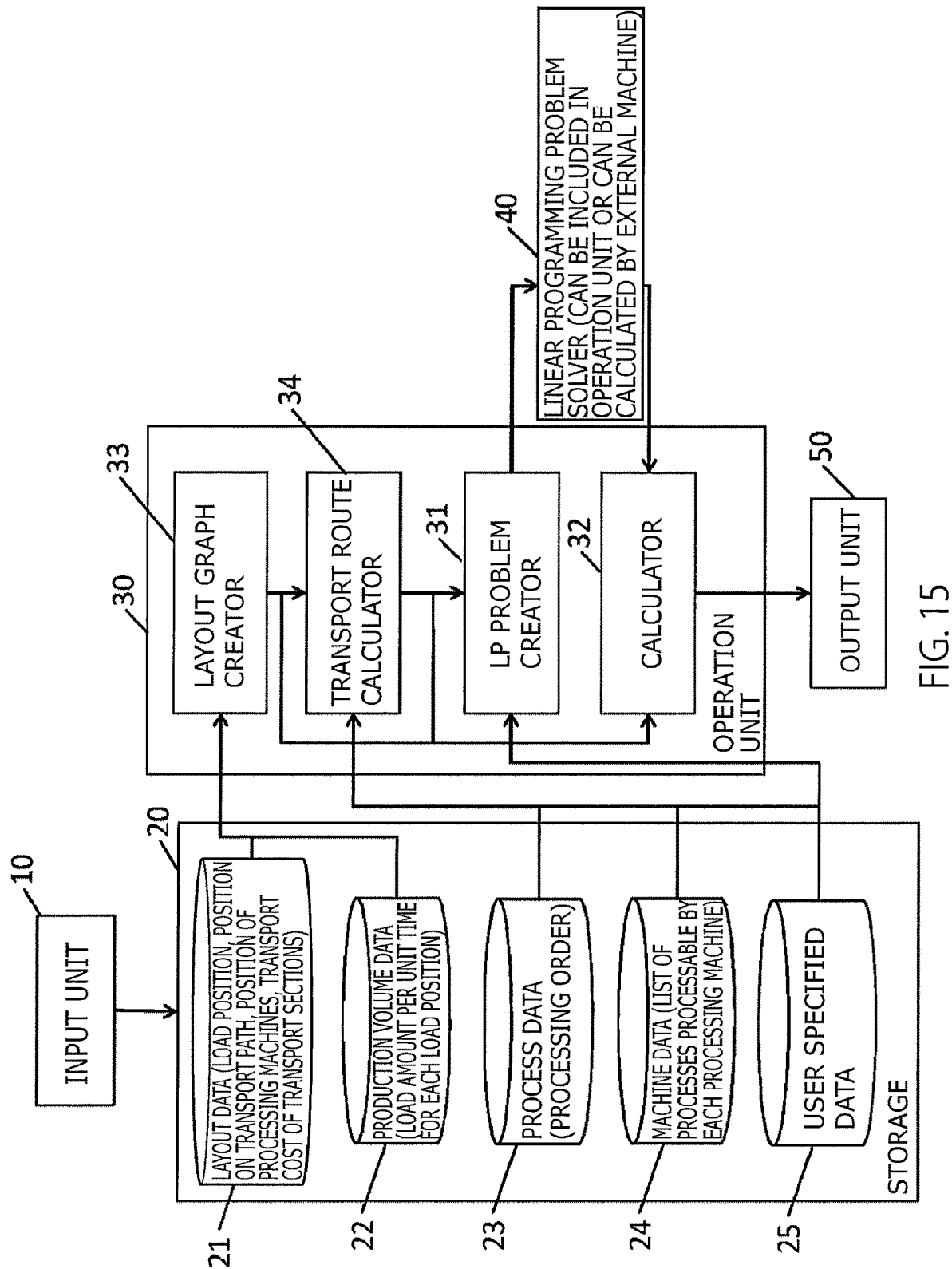
FIG. 15 is a block diagram of a fourth embodiment.

FIG. 15 is a block diagram showing a fourth embodiment. As the procedures of the fourth embodiment, there is a procedure of providing a constraint equation to the linear programming problem created by the LP problem creator 31 by using the user specified data 25 stored in the storage 20. Procedures other than this are identical to those of the other embodiments, and thus the procedure of providing the constraint equation to the linear programming problem based on the user specified data newly added here is described.

User specified data 25 refers to the constraint equation imposed at the time of solving the linear programming problem and includes the number of goods that can be processed by a certain processing machine and conditions such as a time required for processing goods by a certain processing machine and the transport amount per unit time from the processing machine A to the processing machine B.

As described above, an objective expression of the linear programming problem is expressed by the following formula (3).

$$\min. \sum_{n=1}^{|N|} \sum_{m=1}^{|M|} W[n][m] \times r[n][m] \quad (3)$$

As the constraint equation at the time of calculating the linear programming problem of the formula (3), the following can be considered.

For example, when it is desired to process the same number of goods by the processing machines that handle the (n+1)th process, the following formula (4) is added as the constraint equation.

$$u_m = \text{gross input} \div |M| \text{ for all } m=1, \ldots, |M| \quad (4)$$

When a time Sm required for processing goods by the processing machine Mm is provided and it is desired to equalize a movable time of the processing machine, the following formula (5) is added as the constraint equation.

$$u_m \times S_m = u_{m+1} \times S_{m+1} \text{ for all } m=1, \ldots |M|-1 \quad (5)$$

Furthermore, when it is desired to set the amount of goods to be processed by the processing machine Mm as a value Xm specified by the user, the following formula (6) is added as the constraint equation.

$$u_m = X_m \quad (6)$$

When it is desired to set the amount of goods to be processed by the processing machine Mm as XM or smaller, the following formula (7) is added.

$$u_m \leq X_m \quad (7)$$

When it is desired to set the amount of goods to be processed by the processing machine Mm as XM or larger, the following formula (8) is added.

$$u_m \geq X_m \quad (8)$$

When it is desired to set the transport amount per unit time from the processing machine Nn to the processing machine Mm as the user specified value Zm, the following formula (9) is added as the constraint equation.

$$r[n][m] = Z_m \quad (9)$$

When it is desired to set the transport amount per unit time as Zm or smaller, the following formula (10) is added.

$$r[n][m] \leq Z_m \quad (10)$$

When it is desired to set the transport amount per unit time as Zm or smaller, the following formula (11) is added.

$$r[n][m] \geq Z_m \quad (11)$$

By solving the linear programming problem created in this manner by the solver, the values of the variables u1 to u|M| and the variable r[n][m] are obtained.

As described above, according to the fourth embodiment, by using the user specified data 25, a simulation can be performed under conditions specifying a use status (a congestion status) of the transport section when it is assumed that the amount of goods to be processed in each process is equally allocated to all the processing machines, the use status (the congestion status) of the transport section when it is assumed that the processing time in each process is equalized for all the processing machines, and the amount of goods to be processed in each process and each machine.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A simulation machine comprising:
a storage storing layout data including a plurality of transport sections constituting a transport path for transporting goods, a load position at which the goods are loaded in the transport path, a transport cost including a cost required for transporting the goods for each of the transport sections, and an arrangement position in the transport path of a plurality of processing machines handling a plurality of processes with respect to the goods, process data including a processing order with respect to the goods, machine data including association information between the processes and processing machines that can handle the processes, and production volume data including a load amount at the load position;
a CPU creating a linear programming problem in which a transport amount per unit time between respective processing machines handling an nth process, n is an integer, and a processing machine handling an (n+1)th process is set as a variable, based on the layout data, the process data, the machine data, and the production volume data, the CPU having a function to solve the linear programming problem for n in the order of n from n=0 indicating a process at a load position in the transport path to n=N+1 indicating a process at an ejecting position in the transport path, and calculating a transport amount per unit time for each of the transport sections by using a transport amount per unit time between the processing machines in all the processes included in a solution of the linear programming problem, and the CPU solving the linear programming problem by solving $$\min. \sum_{n=1}^{|N|} \sum_{m=1}^{|M|} W[n][m] \times r[n][m]$$

in which N, M indicate number of processing machines, w[n][m] is transport cost of a transport route between processing machine Nn to Mm and r[n][m] is a variable to store a transport flow rate from processing machine Nn to Mm; and
the CPU outputting on a display a congestion status of the transport flow rate of the transport path between branch points of the transport path based on the solved linear programming problem.

2. The simulation machine of claim 1, wherein the CPU creates a layout graph in which the load position, a branching position of the transport path, and positions of the processing machines are designated as nodes, a transport direction of the transport path is designated as a direction of a directed edge, and a weight of the directed edge is designated as a transport cost between the nodes, based on the layout data.

3. The simulation machine of claim 2, comprising a transport route calculator determining a transport route indicating a route in which the goods pass through the transport path from the respective processing machines handling the nth process to the processing machine handling the (n±1)th process, based on the layout graph, the process data, and the machine data, wherein
the CPU creates a linear programming problem by using the transport route determined by the transport route calculator.

4. The simulation machine of claim 1, wherein the storage stores a position of a machine section defining the processing machines and number thereof, instead of an arrangement position of the processing machines.

5. The simulation machine of claim 1, wherein
the storage stores user specified data in which number of goods processable by the processing machines is specified by a user, and
the CPU creates a linear programming problem based on the user specified data.

6. The simulation machine of claim 1, wherein
the storage stores user specified data in which a transport amount per unit time between specific processing machines is specified by a user, and
the CPU creates a linear programming problem based on the user specified data.

7. The simulation machine of claim 3, wherein the transport route calculator minimizes the transport route between the respective processing machines.

8. The simulation machine of claim 1, wherein
the storage stores user specified data in which the transport path is specified by a user, and
the CPU creates a linear programming problem based on the user specified data.

9. The simulation machine of claim 1, wherein the CPU creates a linear programming problem in which a load amount of goods to respective processing machines that can handle the processes is equalized.

10. The simulation machine of claim 1, wherein
a time required for processing the goods by each of the processing machines is included as the machine data, and
the CPU creates a linear programming problem so as to equalize an operating time of each of the processing machines handling the processes.

11. The simulation machine of claim 1, wherein
a solution of the linear programming problem includes amount of goods processed in all the processes for each of the processing machines, and
the CPU calculates the amount of goods for each of the processing machines.

12. The simulation machine of claim 1, wherein a solution of the variable in the linear programming problem is obtained by using a solver for solving the linear programming problem.

13. A simulation method in a simulation machine comprising a CPU creating a linear programming problem in which a transport amount of goods per unit time between respective processing machines handling a process is set as a variable and calculating a transport amount of the goods per unit time for each of transport sections based on a solution of the linear programming problem, the simulation method comprising:
creating the linear programming problem in the CPU in which a transport amount per unit time between respective processing machines handling an nth process, n is an integer, and a processing machine handling an (n+1)th process is set as a variable, based on layout data, process data, machine data and production volume data, the layout data including the plurality of transport sections constituting a transport path for transporting goods, a load position at which the goods are loaded in the transport path, a transport cost including a cost required for transporting the goods for each of the transport sections, and an arrangement position in the transport path of a plurality of processing machines handling a plurality of processes with respect to the goods, the process data including a processing order with respect to the goods, the machine data including association information between the processes and the processing machines that can handle the processes, and the production volume data including a load amount at the load position;
solving the linear programming problem for n in the order of n from n=0 indicating a process at a load position in the transport path to n=N+1 indicating a process at an ejecting position in the transport path, using the CPU; and
calculating a transport amount per unit time for each of the transport sections in the CPU by using a transport amount per unit time between the processing machines in all the processes included in a solution of the linear programming problem, and
the solving the linear programming problem by solving $$\min. \sum_{n=1}^{|N|} \sum_{m=1}^{|M|} W[n][m] \times r[n][m]$$

in which N, M indicate number of processing machines, w[n][m] is transport cost of a transport route between processing machine Nn to Mm and r[n][m] is a variable to store a transport flow rate from processing machine Nn to Mm; and
outputting on a display a congestion status of the transport flow rate of the transport path between branch points of the transport path based on the solved linear programming problem.

* * * * *